United States Patent
Choi et al.

(10) Patent No.: US 7,648,892 B2
(45) Date of Patent: Jan. 19, 2010

(54) METHODS AND APPARATUS FOR DEPOSITING A MICROCRYSTALLINE SILICON FILM FOR PHOTOVOLTAIC DEVICE

(75) Inventors: Soo Young Choi, Fremont, CA (US);
Takako Takehara, Hayward, CA (US);
John M. White, Hayward, CA (US);
Yong Kee Chae, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/258,194

(22) Filed: Oct. 24, 2008

(65) Prior Publication Data
US 2009/0053847 A1      Feb. 26, 2009

Related U.S. Application Data

(62) Division of application No. 11/426,127, filed on Jun. 23, 2006.

(51) Int. Cl.
*H01L 21/30* (2006.01)
*H01L 21/36* (2006.01)

(52) U.S. Cl. .................. 438/478; 438/488; 438/502

(58) Field of Classification Search .............. 438/478, 438/488, 502, 509
See application file for complete search history.

(56) References Cited

U.S. PATENT DOCUMENTS

| | | | |
|---|---|---|---|
| 4,063,735 A | 12/1977 | Wendel | |
| 4,068,043 A | 1/1978 | Carr | |
| 4,400,577 A | 8/1983 | Spear | |
| 4,471,155 A | 9/1984 | Mohr et al. | |
| 4,476,346 A | 10/1984 | Tawada et al. | |
| 4,490,573 A | 12/1984 | Gibbons | |
| 4,728,370 A | 3/1988 | Ishii et al. | |
| 4,755,475 A | 7/1988 | Kiyama et al. | |
| 4,776,894 A | 10/1988 | Watanabe et al. | |
| 4,841,908 A | 6/1989 | Jacobson et al. | |
| 4,878,097 A | 10/1989 | Yamazaki | |
| 5,021,100 A | 6/1991 | Ishihara et al. | |
| 5,032,884 A | 7/1991 | Yamagishi et al. | |
| 5,252,142 A | 10/1993 | Matsuyama et al. | |
| 5,256,887 A | 10/1993 | Yang | |
| 5,677,236 A | 10/1997 | Saitoh et al. | |
| 5,700,467 A | 12/1997 | Shima et al. | |
| 5,730,808 A | 3/1998 | Yang et al. | |

(Continued)

FOREIGN PATENT DOCUMENTS

EP      0 994 515      4/2000

(Continued)

OTHER PUBLICATIONS

O. Vetterl, et al "Preparation Temperature Effects in Microcrystalline Silicon Thin Film Solar Cells", Mat. Res. Soc. Symp. Proc. vol. 664 p. A 25.8.1-A 25.8.6, 2001.

(Continued)

*Primary Examiner*—Phuc T Dang
(74) *Attorney, Agent, or Firm*—Patterson & Sheridan

(57) ABSTRACT

Methods for depositing a microcrystalline silicon film layer with improved deposition rate and film quality are provided in the present invention. Also, a photovoltaic (PV) cell having a microcrystalline silicon film is provided. In one embodiment, the method produces a microcrystalline silicon film on a substrate at a deposition rate greater than about 20 nm per minute, wherein the microcrystalline silicon film has a crystallized volume between about 20 percent to about 80 percent.

16 Claims, 4 Drawing Sheets

U.S. PATENT DOCUMENTS

| | | | |
|---|---|---|---|
| 5,738,732 A | 4/1998 | Nakamura et al. | |
| 5,797,998 A | 8/1998 | Wenham et al. | |
| 5,913,986 A | 6/1999 | Matsuyama | |
| 5,927,994 A | 7/1999 | Kohda et al. | |
| 5,942,050 A | 8/1999 | Green et al. | |
| 6,100,466 A | 8/2000 | Nishimoto | |
| 6,121,541 A | 9/2000 | Arya | |
| 6,180,870 B1 | 1/2001 | Sano et al. | |
| 6,190,932 B1 | 2/2001 | Yoshimi et al. | |
| 6,200,825 B1 | 3/2001 | Yoshimi et al. | |
| 6,222,115 B1 | 4/2001 | Nakanishi | |
| 6,242,686 B1 | 6/2001 | Kishimoto et al. | |
| 6,265,288 B1 | 7/2001 | Okamoto et al. | |
| 6,288,325 B1 | 9/2001 | Jansen et al. | |
| 6,297,443 B1 | 10/2001 | Nakajima et al. | |
| 6,307,146 B1 | 10/2001 | Takeuchi et al. | |
| 6,309,906 B1 | 10/2001 | Meier et al. | |
| 6,326,304 B1 | 12/2001 | Yoshimi et al. | |
| 6,337,224 B1 * | 1/2002 | Okamoto et al. | 438/69 |
| 6,380,480 B1 | 4/2002 | Norimatsu et al. | |
| 6,395,973 B2 | 5/2002 | Fujisawa et al. | |
| 6,444,277 B1 | 9/2002 | Law et al. | |
| 6,459,034 B2 | 10/2002 | Muramoto et al. | |
| 6,566,159 B2 | 5/2003 | Sawada et al. | |
| 6,602,606 B1 | 8/2003 | Fujisawa et al. | |
| 6,632,993 B2 | 10/2003 | Hayashi et al. | |
| 6,634,572 B1 * | 10/2003 | Burgener | 239/418 |
| 6,645,573 B2 | 11/2003 | Higashikawa et al. | |
| 6,750,394 B2 | 6/2004 | Yamamoto et al. | |
| 6,777,610 B2 | 8/2004 | Yamada et al. | |
| 6,825,104 B2 | 11/2004 | Horzel et al. | |
| 6,825,408 B2 | 11/2004 | Nagano et al. | |
| 6,989,553 B2 | 1/2006 | Yokogawa et al. | |
| 7,064,263 B2 | 6/2006 | Sano et al. | |
| 7,071,018 B2 | 7/2006 | Mason et al. | |
| 7,074,641 B2 | 7/2006 | Kondo et al. | |
| 7,235,810 B1 | 6/2007 | Yamazaki et al. | |
| 7,238,545 B2 | 7/2007 | Yoshimi et al. | |
| 7,256,140 B2 | 8/2007 | Call et al. | |
| 7,309,832 B2 | 12/2007 | Friedman et al. | |
| 7,332,226 B2 | 2/2008 | Fujisawa at al. | |
| 7,351,993 B2 | 4/2008 | Atanackovic | |
| 7,375,378 B2 | 5/2008 | Manivannan, et al. | |
| 7,402,747 B2 | 7/2008 | Sugawara et al. | |
| 2001/0035206 A1 | 11/2001 | Inamasu et al. | |
| 2001/0051388 A1 | 12/2001 | Shiozaki et al. | |
| 2002/0033191 A1 | 3/2002 | Kondo et al. | |
| 2003/0013280 A1 | 1/2003 | Yamanaka | |
| 2003/0041894 A1 | 3/2003 | Sverdrup et al. | |
| 2003/0044539 A1 | 3/2003 | Oswald | |
| 2003/0104664 A1 | 6/2003 | Kondo et al. | |
| 2004/0082097 A1 | 4/2004 | Lohmeyer et al. | |
| 2004/0187914 A1 | 9/2004 | Matsuda et al. | |
| 2004/0231590 A1 | 11/2004 | Ovshinsky | |
| 2005/0115504 A1 | 6/2005 | Ueda et al. | |
| 2005/0173704 A1 | 8/2005 | Saito et al. | |
| 2005/0189012 A1 | 9/2005 | Kondo et al. | |
| 2005/0251990 A1 | 11/2005 | Choi et al. | |
| 2005/0284517 A1 | 12/2005 | Shinohara | |
| 2006/0038182 A1 | 2/2006 | Rogers et al. | |
| 2006/0060138 A1 | 3/2006 | Keller et al. | |
| 2006/0134496 A1 * | 6/2006 | Won et al. | 429/34 |
| 2006/0169317 A1 | 8/2006 | Sato et al. | |
| 2006/0249196 A1 | 11/2006 | Shima | |
| 2006/0283496 A1 | 12/2006 | Okamoto et al. | |
| 2007/0039942 A1 | 2/2007 | Leung et al. | |
| 2007/0137698 A1 | 6/2007 | Wanlass et al. | |
| 2007/0227579 A1 | 10/2007 | Buller et al. | |
| 2007/0249898 A1 | 10/2007 | Otawara | |
| 2007/0298590 A1 | 12/2007 | Choi et al. | |
| 2008/0047599 A1 | 2/2008 | Buller et al. | |
| 2008/0047603 A1 | 2/2008 | Krasnov | |
| 2008/0057220 A1 | 3/2008 | Bachrach et al. | |
| 2008/0110491 A1 | 5/2008 | Buller et al. | |
| 2008/0153280 A1 | 6/2008 | Li et al. | |
| 2008/0156370 A1 | 7/2008 | Abdallah et al. | |
| 2008/0160661 A1 | 7/2008 | Henley | |
| 2008/0173350 A1 | 7/2008 | Choi et al. | |
| 2008/0188033 A1 | 8/2008 | Choi et al. | |
| 2008/0196761 A1 | 8/2008 | Nakano et al. | |

FOREIGN PATENT DOCUMENTS

| | | |
|---|---|---|
| EP | 1 650 811 | 4/2006 |
| JP | 4063735 | 2/1992 |
| JP | 4068043 | 3/1992 |
| JP | 2004/071716 | 3/2004 |
| JP | 2004/296652 | 10/2004 |
| JP | 2005/135986 | 5/2005 |
| JP | 2006/310694 | 11/2006 |
| JP | 2006/319068 | 11/2006 |
| JP | 2007/035914 | 2/2007 |
| JP | 2007/305826 | 11/2007 |
| JP | 2008/181965 | 8/2008 |
| WO | WO 03/065462 | 8/2003 |
| WO | WO 2007/118252 | 10/2007 |
| WO | WO 07 149945 | 12/2007 |

OTHER PUBLICATIONS

Stefan Klein, et al. "Microcrystalline Silicon Prepared by Hot-Wire Chemical Vapor Deposition for Thin Film Solar Cell Applications", Jpn J. Appl. Phys. vol. 41(2002) pp. L 10-12, Jan. 2002.

S. Klein, et al "High Efficiency Thin Film Solar Cells with Intrinsic Microcrystalline Silicon Prepared by Hot Wire CVD" Mat. Res. Soc. Symp. Proc. vol. 715 @ 2002 Materials Research Society, pp. A26.2.1-A 26.2.6.

Ujjwal K. Das et al "Amorphous and Microcrystalline silicon Solar Cells Grown by Pulsed PECVD Technique", Mat. Res. Soc. Symp. Proc. vol. 715 @ 2002 Materials Research Society pp. A. 26.6.1-A 26.6.6.

International Search Report and Written Opinion of PCT/US07/71703, dated Dec. 6, 2007.

PCT Search Report and Written Opinion for PCT/US08/59274, Aug. 26, 2008, consists of 9 unnumbered pages.

PCT Search Report and Written Opinion for PCT/US08/70900, Oct. 14, 2008, consists of 13 pages. (APPM/011709PCP02).

International Search Report and Written Opinion dated Jun. 27, 2008 for International Application No. PCT/US08/50770. (APPM/011709PCT).

Rech et al. "Amorphous and Microcrystalline Silicon Solar Cells Prepared at High Deposition Rates Using RF(13.56MHz) Plasma Excitation Frequencies." Solar Energy Materials & Solar Cells 66 (2001), pp. 267-273.

Platz, et al. "H2-Dilution vs. Buffer Layers for Increased Voc." Insistut de Microtechnique, Universite de Neuchatel, Rue A-L. Breguet 2, CH-2000 Neuchatel, Switzerland, 1997.

Office Action U.S. Appl. No. 11/876,173. Dated Feb. 20, 2009.

Office Action U.S. Appl. No. 11/426,127. Dated Jan. 6, 2009.

D.Das, et al. "Characterization of Undoped µc-SiO:H films prepared from (SiH4+CO2+H2)— plasma in RF glow discharge, Solar Energy Materials & Solar Cells 63" (2000), pp. 285-297.

A. Lambertz, et al. "Microcrystalline silicone oxide as intermediate reflector for thin film silicon solar cells", 22nd European Photovoltaic Solar Energy Conference, Sep. 3-7, 2007, Milan, Italy, pp. 1839-1842.

Buehlmann, et al. "In situ silicon oxide based intermediate reflector for thin-film silicon micromorph solar cells", Applied Physics Letters 91, 143505 (2007).

K. Yamamoto et al. "A Thin-Film Silicon Solar Cell and Module, Progress in Photovoltaics: Research and Applications". 2005, 13, pp. 489-494.

* cited by examiner

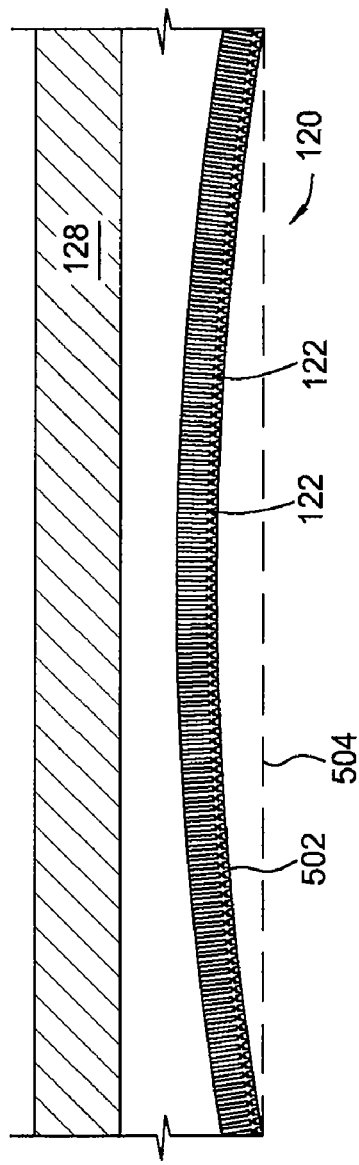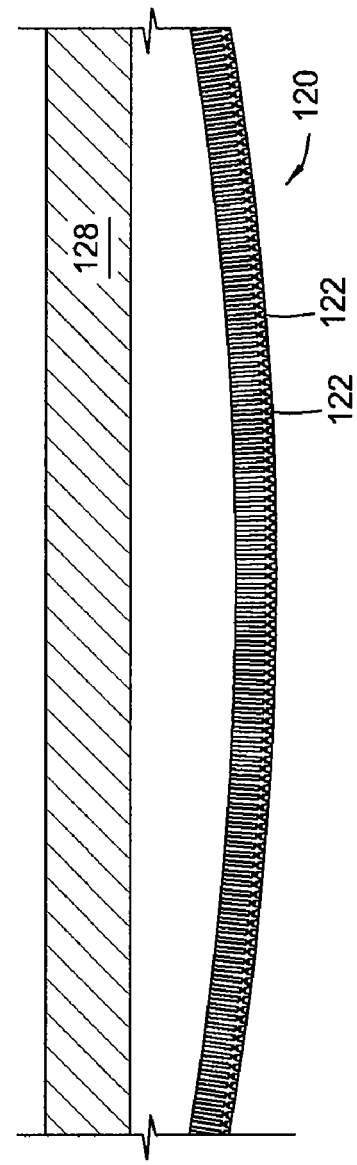

METHODS AND APPARATUS FOR DEPOSITING A MICROCRYSTALLINE SILICON FILM FOR PHOTOVOLTAIC DEVICE

CROSS-REFERENCE TO RELATED APPLICATIONS

This application is a divisional of and claims the benefit of co-pending U.S. patent application Ser. No. 11/426,127, filed Jun. 23, 2006, which is incorporated herein by reference in its entirety.

BACKGROUND OF THE DISCLOSURE

1. Field of the Invention

The present invention relates to methods and apparatus for depositing microcrystalline silicon film for photovoltaic devices.

2. Description of the Background Art

Photovoltaic devices (PV) or solar cells are devices which convert sunlight into direct current (DC) electrical power. PV or solar cells typically have one or more p-n junctions. Each junction comprises two different regions within a semiconductor material where one side is denoted as the p-type region and the other as the n-type region. When the p-n junction of the PV cell is exposed to sunlight (consisting of energy from photons), the sunlight is directly converted to electricity through the PV effect. PV solar cells generate a specific amount of electric power and cells are tiled into modules sized to deliver the desired amount of system power. PV modules are created by connecting a number of PV solar cells and are then joined into panels with specific frames and connectors.

Microcrystalline silicon film (μc-Si) is one type of film being used to form PV devices. However, a production worthy apparatus and process has yet to be developed to be able to provide PV devices at low cost. For example, insufficient crystallinity of the silicon film may cause incomplete formation and fraction of the film, thereby reducing the conversion efficiency in a PV solar cell. Additionally, conventional deposition processes of microcrystalline silicon film (μc-Si), have slow deposition rates, which disadvantageously reduce manufacturing throughput and increase production costs.

Therefore, there is a need for an improved method for depositing a microcrystalline silicon film.

SUMMARY OF THE INVENTION

The present invention provides methods for depositing a microcrystalline silicon layer with improved deposition rate greater than about 20 nm per minute suitable for use in a PV solar cell. The microcrystalline silicon film is deposited with improved deposition rate and good film qualities. In one embodiment, the method includes providing a substrate having a surface area greater than 1 square meters in a process chamber, flowing a gas mixture including a silane-based gas and $H_2$ gas into the process chamber, maintaining a plasma formed from the gas mixture in the process chamber, and depositing a microcrystalline silicon film on the substrate at a deposition rate greater than about 20 nm per minute, wherein the microcrystalline silicon film has a crystallized volume between about 20 percent to about 80 percent.

In another embodiment, the method for depositing a microcrystalline silicon film includes providing a substrate having a surface area greater than about 1 square meters in a process chamber, flowing a gas mixture including a silane-based gas and $H_2$ gas into the process chamber, wherein the silane based gas at a flow rate at least about 0.2 slm/m$^2$ and $H_2$ gas at a flow rate at least about 10 slm/m$^2$, controlling the substrate temperature at a range between about 100 degrees Celsius to about 400 degrees Celsius, maintaining the process pressure at a range greater than about 3 Torr, applying a RF power density at least about 100 mWatts/cm$_2$ to form a plasma from the gas mixture, and depositing a microcrystalline silicon film on the substrate at a deposition rate greater than about 20 nm per minute, wherein the microcrystalline silicon film has a crystallized volume between about 20 percent to about 80 percent and a hydrogen content between about 0.1 atomic percentage and about 20 atomic percentage.

In yet another embodiment, the method for manufacturing a silicon based photoelectric converter includes providing a substrate in a process chamber, forming a photoelectric converter on the substrate. The photoelectric converter comprises depositing a p-type semiconductor layer on the substrate, depositing an i-type semiconductor layer by a microcrystalline silicon film on the substrate at a deposition rate greater than about 20 nm per minute by a CVD process, wherein the microcrystalline silicon film has a crystallized volume between about 20 percent to about 80 percent, and depositing a n-type semiconductor layer on the microcrystalline silicon film.

In still another embodiment, the method of manufacturing a silicon based photoelectric converter includes providing a substrate on a substrate support assembly disposed in a process chamber, flowing a gas mixture including a silane-based gas and $H_2$ gas through a gas distribution plate into the process chamber, wherein the gas distribution plate comprises a diffuser having a curvature surface, maintaining a spacing between the substrate support assembly and the gas distribution plate, maintaining a plasma formed from the gas mixture in the process chamber, and depositing a microcrystalline silicon film on the substrate at a deposition rate greater than about 20 nm per minute, wherein the microcrystalline silicon film has a crystallized volume between about 20 percent to about 80 percent.

In still another embodiment, the method of manufacturing a silicon based photoelectric converter includes providing a substrate on a substrate support assembly disposed in a process chamber, wherein the substrate support assembly includes cooling channels embedded therein, forming a photoelectric converter on the substrate by depositing a microcrystalline silicon film as an i-type semiconductor layer disposed between a p-type semiconductor layer and a n-type semiconductor layer, wherein the microcrystalline silicon film is deposited by a gas mixture supplied from a diffuser having a curvature surface.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

FIG. 5A is a cross sectional view of a diffuser having a concave horizontal profile; and FIG. 5B is a cross sectional view of a diffuser having a convex horizontal profile.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for depositing a microcrystalline silicon layer. Certain embodiments of the present invention provides a microcrystalline deposition process with improved deposition rate greater than about 20 nm per minute suitable for use in a PV solar cell. In certain embodiment, the microcrystalline silicon film layer has a crystallized volume between about 20 percent to about 80 percent. In certain embodiments, the microcrystalline silicon film has a hydrogen content between about 0.1 atomic percentage and about 20 atomic percentage. In certain embodiment, the microcrystalline silicon film has a crystal orientation plane (220) parallel to the surface of the film and an intensity ratio of the (111) diffraction peak relative to the (220) diffraction peak in X-ray diffraction between about 2 and about 0.1. In certain embodiments, the process for depositing the microcrystalline silicon layer utilizes a plasma formed from a gas mixture that includes a silane-based gas and $H_2$ gas.

Figure 1:
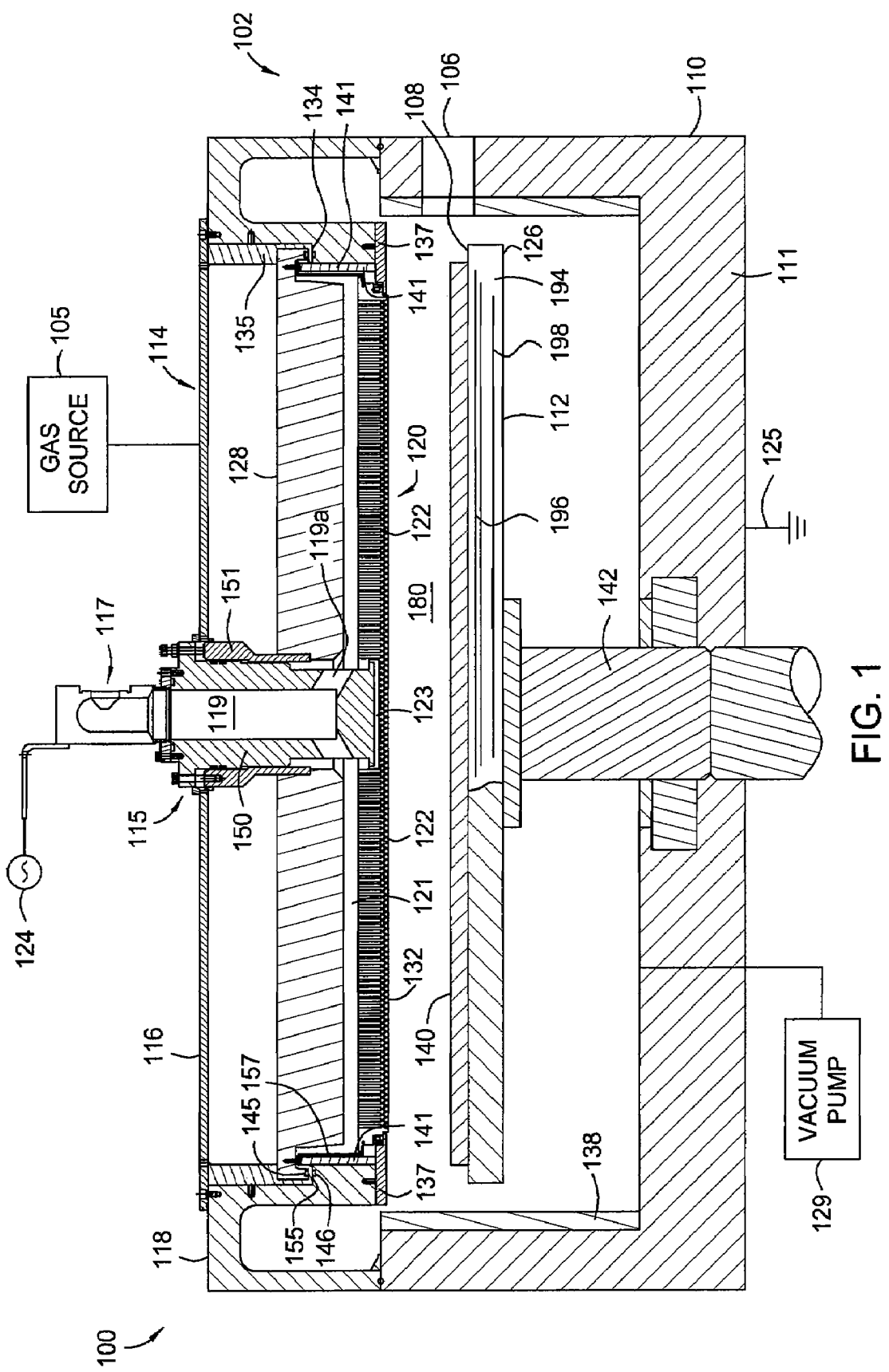
FIG. 1 depicts a schematic cross-sectional view of one embodiment of a process chamber in accordance with the invention.

FIG. 1 is a schematic cross-sectional view of one embodiment of a plasma enhanced chemical vapor deposition system 100 in which the invention may be practiced. One suitable plasma enhanced chemical vapor deposition (PECVD) system is available from AKT, Inc., a subsidiary of Applied Materials, Inc., Santa Clara, Calif. It is contemplated that other plasma processing chambers, including those from other manufactures, may be utilized to practice the present invention.

The system 100 generally includes a processing chamber body 102 having walls 110 and a bottom 111 that partially define a process volume 180. The process volume 180 is typically accessed through a port and/or a valve 106 to facilitate movement of a substrate 140, such as a solar cell glass substrate, stainless steel substrate, or plastic substrate, semiconductor substrate, or other suitable substrate, into and out of the processing chamber body 102. The chamber 100 supports a lid assembly 118 surrounding a gas inlet manifold 114 that consists of a cover plate 116, a first plate 128 and a second plate 120. In one embodiment, the first plate 128 is a backing plate, and the second plate 120 is a gas distribution plate, for example, a diffuser. A vacuum pump 129 is disposed on the bottom of the chamber body 102 to maintain the chamber 100 at a desired pressure range. Optionally, the walls 110 of the chamber 102 may be protected by covering with a liner 138, such as a ceramic material, anodizing or other protective coating to prevent damage during processing.

The diffuser 120 may have a substantial planar surface adapted to provide a plurality of orifices 122 for a process gas or gasses from a gas source 105 coupled to the chamber body 102. The diffuser 120 is positioned above the substrate 140 and suspended vertically by a diffuser gravitational support 115. In one embodiment, the diffuser 120 is supported from an upper lip 155 of the lid assembly 118 by a flexible suspension 157. The flexible suspension 157 is disclosed in detail by U.S. Pat. No. 6,477,980, which issued Nov. 12, 2002 with the title "Flexibly Suspended Gas Distribution Manifold for A Plasma Chamber" and is herein incorporated by reference. The flexible suspension 157 is adapted to support the diffuser 120 from its edges to allow expansion and contraction of the diffuser 120.

In one embodiment, the flexible suspension 157 may have different configuration utilized to facilitate the expansion and contraction of the diffuser 120. In another embodiment, the flexible suspension 157 may be used with the diffuser gravitational support 115 to facilitate the curvature of the diffuser 120. For example, the diffuser 120 may have a concave surface contracted by the diffuser gravitational support 115 and/or flexible suspension 157, as shown in FIG. 5A. Alternatively, the diffuser 120 may have a convex surface expanded by the diffuser gravitational support 115 and/or flexible suspension 157, as shown in FIG. 5B. The surface configuration of the diffuser 120 is disclosed in detail by U.S. Patent Publication No. 2006/0,060,138, filed Sep. 20, 2004 by Keller et al, title "Diffuser Gravity Support", and is herein incorporated by reference.

In the embodiment depicted in FIG. 5A, the diffuser 120 has a concave surface 502 having gradual changing distances between the curvature surface 502 and the flat surface 504, thereby creating different process spacing in the processing volume 180 to the substrate 140. The gradual transition of the narrow spacing region above the edge of the substrate 140 to the slightly wider spacing region above the center of the substrate 140 allows the substrate 140 being processing with different spacing. In another embodiment, the diffuser 120 may be configured to have planar surface, or convex surface, as shown in FIG. 5B, to facilitate different process conditions. The spacing between the diffuser surface 132 and the substrate surface, as shown in FIG. 1, is selected and adjusted to enable the deposition process to be optimized over a wide range of deposition conditions, while maintaining uniformity of film deposition. In one embodiment, the spacing is controlled about 100 mils or larger, such as between about 400 mils to about 1600 mils, such as between about 400 mils and about 1200 mils during processing.

The diffuser gravitational support 115 may supply a process gas to a gas blocks 117 mounted on the support 115. The gas block 117 is in communication with the diffuser 120 via a longitudinal bore 119, within the support 115, and supplies a process gas to the plurality of passages 122 within the diffuser 120. In one embodiment, one or more process gasses travel through the gas block 117, through the longitudinal bore 119, through angled bores 119a, and are deposited in a large plenum 121 created between backing plate 128 and diffuser 120, and a small plenum 123 within the diffuser 120. Subsequently, the one or more process gasses travel from the large plenum 121 and the small plenum 123 through the plurality of orifices 122 within the diffuser 120 to create the processing volume 180 below the diffuser 120. In operation, the substrate 140 is raised to the processing volume 180 and the plasma generated from a plasma source 124 excites gas or gases to deposit films on the substrate 140.

The plurality of orifices 122 may have different configurations to facilitate different gas flow in the processing volume 180. In one embodiment, the orifices 122 may have flare openings having a diameter ranging between about 0.01 inch and about 1.0 inch, such as between about 0.01 inch and about 0.5 inch. The dimension and density of the flare openings of the orifices 122 may be varied across the surface of the diffuser 120. In one embodiment, dimension and densities of the orifices 122 located in the inner (e.g., center) region of the diffuser 120 may be higher than the orifices 122 located in the outer (e.g., edge) region. Examples of orifice configurations and a diffuser that may be used in the chamber 100 are described in commonly assigned U.S. Patent Publication No. 2005/0,251,990, filed Jul. 12, 2004, by Choi et al., U.S. Pat. No. 6,722,827, filed Aug. 8, 2001 by Keller et al.; U.S. Pat. No. 6,477,980, issued Nov. 12, 2002 to White et al; U.S. patent application Ser. No. 11/173,210, filed Jul. 1, 2005 by Choi et al; Ser. No. 10/337,483, filed Jan. 7, 2003 by Blonigan et al.; Publication No. 2005/0,255,257, filed Dec. 22, 2004 by Choi et al.; and Publication No. 2005/0,183,827, filed Feb. 24, 2004 by White et al., all of which are hereby incorporated by reference in their entireties.

A substrate support assembly 112 is generally disposed on the bottom of the chamber body 102. The support assembly 112 is grounded such that RF power, supplied by the plasma source 124, supplied to the diffuser 120 may excite gases, source compounds, and/or precursors present in the process volume 180 as stated above. The RF power from the plasma source 124 is generally selected commensurate with the size of the substrate 140 to drive the chemical vapor deposition process.

In one embodiment, a RF power is applied to the diffuser 120 to generate an electric field in the process volume 180. For example, a power density of about 100 mWatts/cm$^2$ or greater during film depositing. The plasma source 124 and matching network (not shown) create and/or sustain a plasma of the process gases in the process volume 180. Various frequencies of the RF and VHF power may be used to deposit the silicon film. In one embodiment, a RF and VHF power at a range between about 0.3 MHz and about 200 MHz, such as about 13.56 MHz, or about 40 MHz, may be used. In another embodiment, a RF power of about 13.56 MHz and a low frequency RF power of about 350 KHz may be used. In yet another embodiment, a VHF power of about 27 MHz up to about 200 MHz may be utilized to deposit films with high deposition rate.

The substrate support assembly 112 has a lower side 126 and an upper side 108 adapted to support the substrate 140. A stem 142 is coupled to the lower side 126 of the substrate support assembly 112 and connected to a lift system (not shown) for moving the support assembly 112 between an elevated processing position and a lowered substrate transfer position. The stem 142 provides a conduit for coupling electrical and thermocouple leads to the substrate support assembly 112.

The substrate support assembly 112 includes a conductive body 194 having the upper side 108 for supporting the substrate 140 to dispose thereon. The conductive body 194 may be made of a metal or metal alloy material. In one embodiment, the conductive body 194 is made of aluminum. However, other suitable materials can also be used. The substrate support assembly 112 is temperature controlled to maintain a predetermined temperature range during substrate processing. In one embodiment, the substrate support assembly 112 includes one or more electrodes and/or heating elements 198 utilized to control the temperature of the substrate support assembly 112 during processing. The heating elements 198 controllably heat the substrate support assembly 112 and the substrate 140 positioned thereon to a determined temperature range, e.g., a set point temperature of about 100 degrees Celsius or higher. In an exemplary embodiment, the heating elements 198 may include an inner heating element embedded in the center portion of the substrate support assembly 112 and an outer heating element embedded in the edge portion of the substrate support assembly 112. As the outer edge of the substrate 140 may have a temperature lower than the center portion of the substrate 140 contributed by the plasma distribution, the outer heating element is configured to maintain a temperature slightly higher than the temperature of the inner heating element, such as higher than 20 degrees Celsius, thereby maintaining the uniform temperature across the substrate 140. It is contemplated that the temperature configuration of the inner and outer heating element may be varied based on process requirement.

In another embodiment, the substrate support assembly 112 may further include one or more cooling channels 196 embedded within the conductive body 194. The one or more cooling channels 196 are configured to maintain temperature variation in the processing volume 180 within a predetermined temperature range during processing, a temperature variation less than 20 degrees Celsius. The cooling channels 196 may be fabricated from metals or metal alloys which provide desired thermal conductivity. In one embodiment, the cooling channels 196 are made of a stainless steel material.

In one embodiment, the temperature of the substrate support assembly 112 that includes the heating elements 198 and cooling channels 196 embedded therein may control the substrate 140 disposed thereon processed at a desired range that allow substrates with low melt point, such as alkaline glasses, plastic and metal, to be utilized in the present invention. In one embodiment, the heating elements 198 and the cooling channels 196 may maintain a temperature about 100 degrees Celsius or higher, such as between about 150 degrees Celsius to about 550 degrees Celsius.

Figure 2:
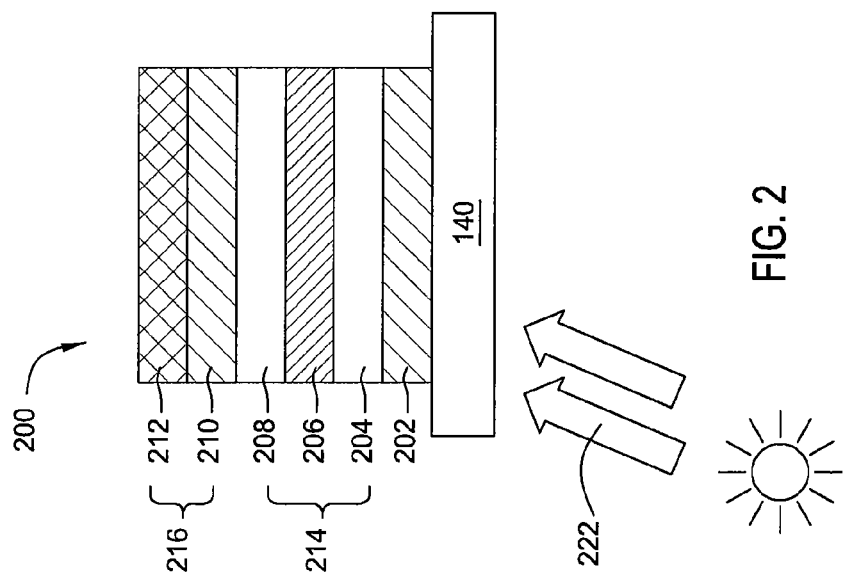
FIG. 2 depicts an exemplary cross sectional view of a crystalline silicon-based thin film PV solar cell in accordance with one embodiment of the present invention.

FIG. 2 depicts an exemplary cross sectional view of a crystalline silicon-based thin film PV solar cell 200 in accordance with one embodiment of the present invention. The crystalline silicon-based thin film PV solar cell 200 includes a substrate 140. The substrate 140 may be thin sheet of metal, plastic, organic material, silicon, glass, quartz, or polymer, among others suitable materials. The substrate 140 may have a surface area greater than about 1 square meters, such as greater than about 2 square meters. An optional dielectric layer (not shown) may be disposed between the substrate 140 and a transmitting conducting oxide (TCO) layer 202. In one embodiment, the optional dielectric layer may be a SiON or silicon oxide (SiO$_2$) layer. The transmitting conducting oxide (TCO) layer 202 may include, but not limited to, at least one oxide layer selected from a group consisting of tin oxide (SnO$_2$), indium tin oxide (ITO), zinc oxide (ZnO), or the combination thereof. The TCO layer 202 may be deposited by a CVD process, a PVD process, or other suitable deposition process.

A photoelectric conversion unit 214 is formed on the TCO layer 202. The photoelectric conversion unit 214 includes a p-type semiconductor layer 204, a n-type semiconductor layer 208, and an intrinsic type (i-type) semiconductor layer 206 as a photoelectric conversion layer. The p-type and n-type semiconductor layers 204, 208 may be silicon based materials doped by an element selected either from group III or V. A group III element doped silicon film is referred to as a p-type silicon film, while a group V element doped silicon film is referred to as a n-type silicon film. In one embodiment, the n-type semiconductor layer 208 may be a phosphorus doped silicon film and the p-type semiconductor layer 204 may be a boron doped silicon film. The doped silicon film includes an amorphous silicon film (a-Si), a polycrystalline film (poly-Si), and a microcrystalline film (μc-Si) with a thickness between around 5 nm and about 50 nm. Alternatively, the doped element in semiconductor layer 204, 208 may be selected to meet device requirements of the PV solar cell 200. The n-type and p-type semiconductor layers 208, 204 may be deposited by a CVD process or other suitable deposition process.

The i-type semiconductor layer 206 is a non-doped type silicon based film. The i-type semiconductor layer 206 may be deposited under process condition controlled to provide film properties having improved photoelectric conversion efficiency. In one embodiment, the i-type semiconductor layer 206 includes i-type polyscrystalline silicon (poly-Si), or i-type microcrystalline silicon film (μc-Si). The i-type crystalline silicon-based film 206 may be deposited in the processing chamber 102 or other suitable processing chambers.

In the embodiment depicted in FIG. 2, the i-type semiconductor layer 206 is a microcrystalline silicon film (μc-Si) having a crystallized volume between about 20 percent and about 80 percent, for example, greater than about 50 percent. The substrate temperature during the deposition process is maintained at a predetermined range. In one embodiment, the substrate temperature is maintained at less than about 400 degrees Celsius so as to allow the substrates with low melt point, such as alkaline glasses, plastic and metal, to be utilized in the present invention. In another embodiment, the substrate temperature in the process chamber is maintained at a range between about 100 degrees Celsius to about 400 degrees Celsius. In yet another embodiment, the substrate temperature is maintained at a range about 150 degrees Celsius to about 400 degrees Celsius, such as 200 degrees Celsius.

During processing, a gas mixture is flowed into the process chamber 102 and used to form a RF plasma and deposit the i-type μc-Si film 206. In one embodiment, the gas mixture includes a silane-based gas and a hydrogen gas ($H_2$). Suitable examples of the silane-based gas include, but not limited to, mono-silane ($SiH_4$), di-silane ($Si_2H_6$), silicon tetrafluoride ($SiF_4$), silicon tetrachloride ($SiCl_4$), and dichlorsilane ($SiH_2Cl_2$), and the like. The gas ratio of the silane-based gas and $H_2$ gas is maintained to control reaction behavior of the gas mixture, thereby allowing a desired proportion of the crystallization, e.g., between about 20 percent and about 80 percent, of the formed silicon film. In one embodiment, the silane-based gas is $SiH_4$. The $SiH_4$ gas may be supplied at a flow rate at least about 0.2 slm/m$^2$ and the $H_2$ gas may be supplied at a flow rate at least about 10 slm/m$^2$. The gas mixture may have a $H_2$ gas flow controlled greater than $SiH_4$ gas flow. Alternatively, the gas mixture of $SiH_4$ gas and $H_2$ gas may be supplied at a ratio of $SiH_4$ to $H_2$ of between about 1:20 and about 1:200, such as between about 1:80 and about 1:120, for example, about 1:100. Additionally, the process pressure is maintained at between about 1 Torr to about 100 Torr, for example, about 3 Torr to about 20 Torr, such as greater than 3 Torr.

Alternatively, one or more inert gases may be included with the gas mixture provided to the process chamber 102. The inert gas may include, but not limited to, noble gas, such as Ar, He, Xe, and the like. The inert gas may be supplied to the processing chamber 102 at a flow ratio of inert gas to $H_2$ gas of between about 1:10 and about 2:1.

A RF power is applied to maintain the plasma during deposition. In one embodiment, the RF power density may be supplied at least about 100 mWatt/cm$^2$ to obtain a deposition rate greater than 20 nm per minute. The RF power is provided between about 100 kHz and about 100 MHz, such as about 350 kHz or about 13.56 MHz. Alternatively, a VHF power may be utilized to provide a frequency up to between about 27 MHz and about 200 MHz. In embodiments where a high deposition rate is required, the RF power density may be applied at a high power density greater than 300 mWatt/cm$^2$ to obtain a deposition rate greater than 60 nm per minute, such as 100 nm per minute.

The spacing of the substrate to the gas distribution plate assembly 118 may be controlled in accordance with the substrate dimension. In one embodiment, the processing spacing for a substrate greater than 1 square meters is controlled between about 400 mils and about 1200 mils, for example, between about 400 mils and about 800 mils, such as 500 mils.

To facilitate the deposition film quality of i-type μc-Si layer 206, a thin layer prior to the i-type μc-Si film 206 deposition may be deposited and utilized as a seed layer to provide better contact adhesion and interfacial qualities between the p-type semiconductor layers 204 and the i-type μc-Si film 206 for high quality and high fraction of microcrystalline phase formation. In one embodiment, the seed layer may be deposited at a relatively low deposition rate, such as less than 20 nm per minute, having a thickness between about 20 Å and about 500 Å, such as between about 50 Å and about 300 Å. The low deposition rate of the seed layer may be controlled by a gas mixture having a ratio of silane-based gas to $H_2$ between about 1:100 and about 1:20000, such as between 1:200 and 1:1000, for example 1:500 with other process parameters substantially similar as the i-type μc-Si layer 206 deposition. In another embodiment, the i-type μc-Si film 206 deposition may include a two step deposition process having a first step depositing the seed layer and a second step depositing the bulk i-type μc-Si layer 206. The first step seed layer deposition process has a relatively lower deposition rate, such as less than 10 nm per minute, controlled by a gas mixture having a ratio of silane-based gas to $H_2$ between about 1:100 and about 1:2000, such as between 1:200 and 1:1000, for example 1:500. The second step bulk i-type μc-Si layer 206 has a deposition rate greater than 20 nm per minute as stated above to facilitate manufacture throughout and cost. In yet another embodiment, the second step of bulk i-type μc-Si layer 206 is grown by gradual change of $H_2$ gas ratio used to dilute the gas mixture, rending the deposited a desired graded film. For example, the gradual change of $H_2$ gas ratio for gas mixture dilution may be varied between about 1:200 and about 1:20 during the seed layer deposition period, thereby rending the process starting from supplying a gas mixture with a relatively higher $H_2$ dilution gas ratio to a gas mixture with relatively a lower $H_2$ dilution gas ratio. As such, the fraction of microcrystalline phase may be controlled within a desired thickness of μc-Si layer 206. The gradual change of $H_2$ dilution gas ratio may be achieved by controlled digital mode or analog mode of $H_2$ gas flow. In still another embodiment, the first step of seed layer may be deposited as a portion of the p-type semiconductor layers 204.

The process gas mixture, process temperature, and RF power described above provide an i-type silicon film 206 having an advantageous crystalline structure. For example, small grained μc-Si film, e.g., about 20-30 nm, may be obtained while processing at a temperate of between about 150 degrees Celsius and about 350 degrees Celsius. Large grained poly-Si film, e.g., greater than about 100 nm, may be obtained while processing at a temperate of between about 350 degrees Celsius and about 600 degrees Celsius. Accordingly, as the RF power is selected at a relative high range to facilitate the deposition rate of the μc-Si film, a predetermined flow ratio of the gas mixture is utilized to deposit the μc-Si film having a desired crystalline and film property, thereby facilitating the PV solar cell working at desired photoelectric conversion efficiency.

In one embodiment, the deposited i-type μc-Si film 206 is a hydrogenated μc-Si film having a hydrogen content between about 0.1 atomic percentage and about 20 atomic percentage, for example between about 1 atomic percentage and about 10 atomic percentage, such as less than 10 atomic percentage. The grains of the deposited i-type μc-Si film 206 have a crystal orientation plane (220) parallel to the surface of the film and the intensity ratio of the (111) diffraction peak relative to the (220) diffraction peak in X-ray diffraction is between about 2 and about 0.1, for example, about less than 1.0. Additionally, the deposited i-type μc-Si film 206 may have a thickness between about 500 nm and about 10 μm, for example, about 1000 nm and about 5000 nm.

Referring back to FIG. 2, after the photoelectric conversion unit 214 is formed on the TCO layer 202, a backside electrode 216 is disposed on the photoelectric conversion unit 214. In one embodiment, the backside electrode 216 may be formed by a stacked film that includes a transmitting conducting oxide (TCO) layer 210 and a conductive layer 212. The conductive layer 212 may include, but not limited to, a metal layer selected from a group consisting of Ti, Cr, Al, Ag, Au, Cu, Pt, or an alloy of the combination thereof. The transmitting conducting oxide (TCO) layer 210 may be fabricated from a material similar as the TCO layer 202 formed on the substrate. Suitable transmitting conducting oxide (TCO) layer 210 include, but not limited to, tin oxide ($SnO_2$), indium tin oxide (ITO), zinc oxide (ZnO), or the combination thereof. The metal layer 212 and TCO layer 210 may be deposited by a CVD process, a PVD process, or other suitable deposition process.

In operation, incident light 222 provided by the environment, e.g., sunlight or other photons, is supplied to the PV solar cell 200. The photoelectric conversion unit 214 in the PV solar cell 200 absorbs the light energy and converts the light energy into electrical energy by the operation of the p-i-n junctions formed in the photoelectric conversion unit 214, thereby generating electricity or energy. Alternatively, the PV solar cell 200 may be fabricated or deposited in a reversed order. For example, the substrate 140 may be disposed over backside electrode 216.

Figure 3:
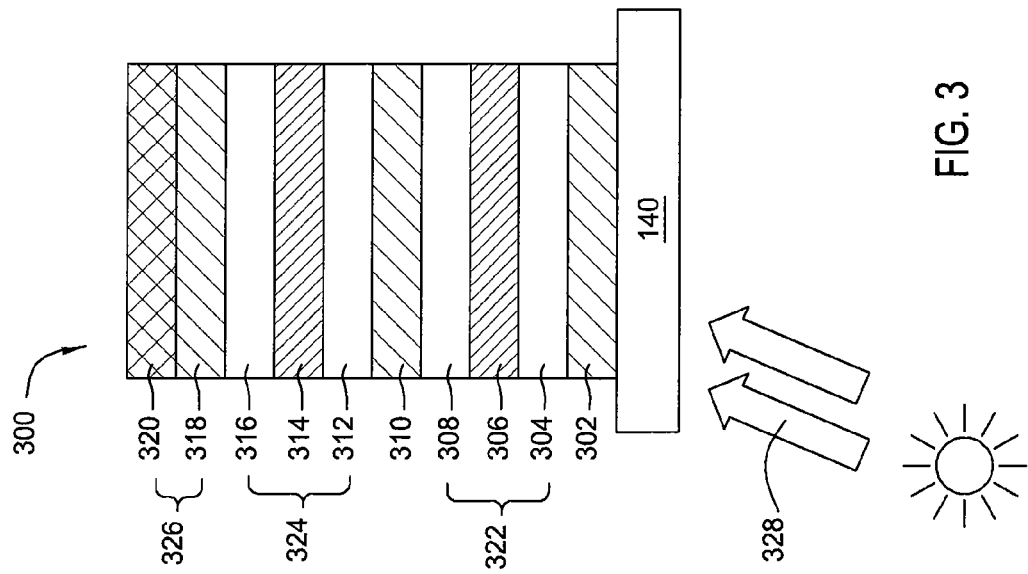
FIG. 3 depicts an exemplary cross sectional view of a tandem type PV solar cell 300 in accordance with one embodiment of the present invention.

FIG. 3 depicts an exemplary cross sectional view of a tandem type PV solar cell 300 in accordance with another embodiment of the present invention. Tandem type PV solar cell 300 has a similar structure of the PV solar cell 200 including a TCO layer 302 formed on a sheet 140 and a first photoelectric conversion unit 322 formed on the TCO layer 302, as described above in FIG. 2. In one embodiment, the i-type semiconductor layer 306 in the first photoelectric conversion unit 322 is deposited as an amorphous Si film. Alternatively, the i-type semiconductor layer 306 in the first photoelectric conversion unit 322 may be deposited as a poly-Si or an μc-Si film. An optional interfacial layer 310 may be formed between the first photoelectric conversion unit 322 and a second photoelectric conversion unit 324. The optional interfacial layer 310 may be a TCO layer as the TCO layer 302 formed on the substrate 140. The combination of the first underlying conversion unit 322 and the second photoelectric conversion unit 324 increases the photoelectric conversion efficiency. The second photoelectric conversion unit 324 may be an μc-Si based photoelectric conversion unit 324 having an μc-Si film as the i-type semiconductor layer 314 sandwiched between a p-type semiconductor layer 312 and a n-type semiconductor layer 316. Alternatively, the i-type semiconductor layer 314 in the second photoelectric conversion unit 324 may be manufactured as the μc-Si film 206 utilized in the photoelectric conversion unit 214 of single junction PV solar cell 200 as described in FIG. 2. Alternatively, the p-type semiconductor layer 312 may be μc-Si layer.

A backside electrode 326 is disposed on the second photoelectric conversion unit 324. The backside electrode 326 may be similar to backside electrode 216 as described in FIG. 2. The backside electrode 326 may comprise a conductive layer 320 formed on a TCO layer 318. The materials of the conductive layer 320 and the TCO layer 318 may be similar to the conductive layer 212 and TCO layer 210 as described in FIG. 2.

In operation, incident light 328 provided by the environment is supplied to the PV solar cell 300. The photoelectric conversion unit 322, 324 in the PV solar cell 300 absorbs the light energy and converts the light energy into electrical energy by operation of the p-i-n junctions formed in the photoelectric conversion unit 324, 322, thereby generating electricity or energy. Alternatively, the PV solar cell 300 may be fabricated or deposited in a reversed order. For example, the substrate 140 may be disposed over the backside electrode 326.

Figure 4:
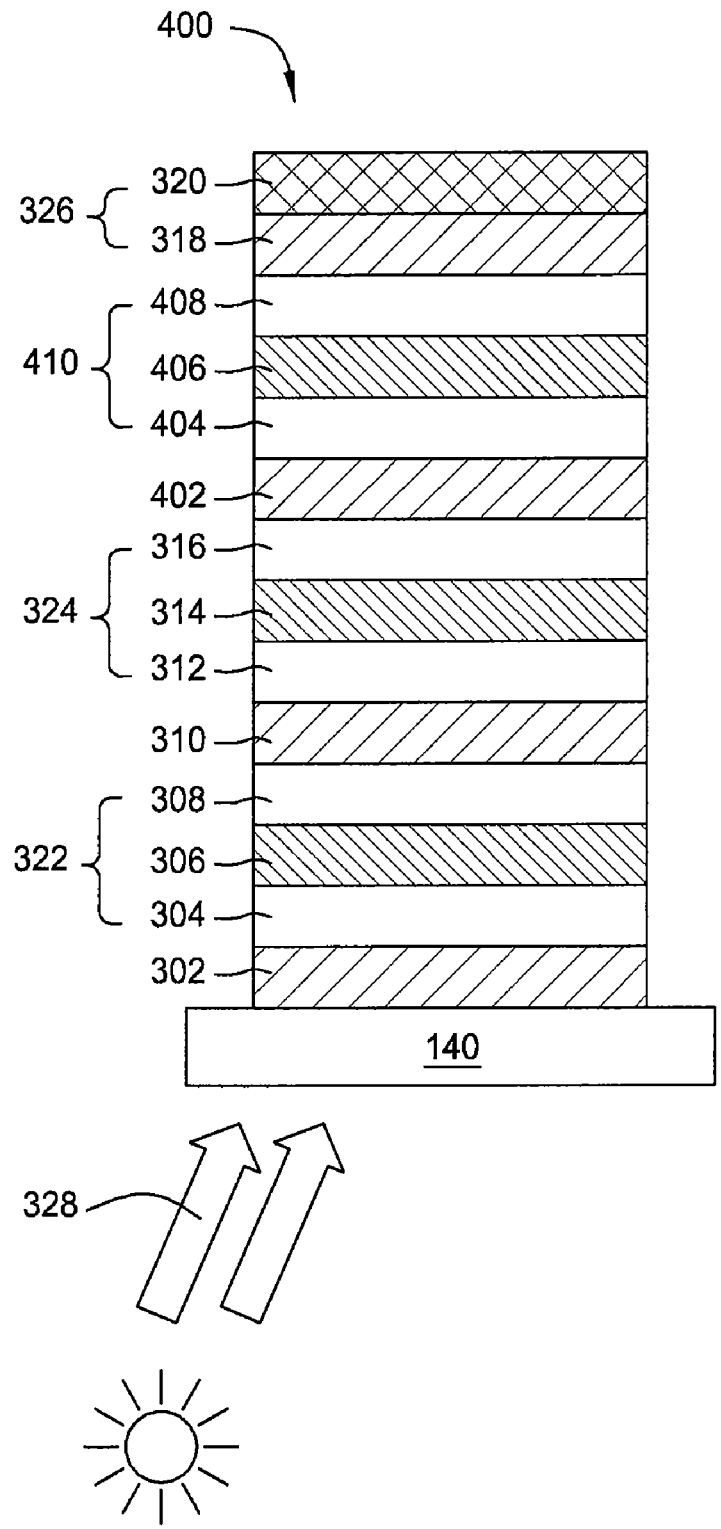
FIG. 4 depicts an exemplary cross sectional view of a triple junction PV solar cell in accordance with one embodiment of the present invention.

Alternatively, a third overlying photoelectric conversion unit 410 may be formed on the second photoelectric conversion unit 324, as shown in FIG. 4. An optional interfacial layer 402 may be disposed between the second photoelectric conversion unit 324 and the third photoelectric conversion unit 410. The optional interfacial layer 402 may be a TCO layer 402 as the TCO layers of 310, 302 as described in FIG. 3. The third photoelectric conversion unit 410 may be substantially similar as the second photoelectric conversion unit 324 having an i-type semiconductor layer 406 disposed between a p-type semiconductor layer 404 and a n-type layer 408. The third photoelectric conversion unit 410 may be a μc-Si-type photoelectric conversion unit having an i-type semiconductor layer 406 formed by an μc-Si film. Alternatively, the i-type semiconductor layer 406 may be formed by a poly-Si or an amorphous silicon layer. Alternatively, the p-type semiconductor layer 312 may be μc-Si layer. It should be noted that one or more photoelectric conversion units may optionally deposited on the third photoelectric conversion unit utilized to promote photoelectric conversion efficiency.

Thus, improved methods for depositing an μc-Si film are provided. The method advantageously increases the deposition rate and film quality of the μc-Si film utilized in a PV solar cell, thereby increasing the photoelectric conversion efficiency and device performance of the PV solar cell as compared to conventional methods.

While the foregoing is directed to embodiments of the present invention, other and further embodiments of the invention may be devised without departing from the basic scope thereof, and the scope thereof is determined by the claims that follow.

What is claimed is:

1. A method of manufacturing a silicon based photoelectric converter, comprising:
   providing a substrate in a process chamber;
   forming a photoelectric converter on the substrate, wherein forming the photoelectric converter comprises:
      depositing a p-type semiconductor layer on the substrate;
      depositing an i-type semiconductor layer comprising a microcrystalline silicon film on the substrate by flowing a gas mixture including a silane-based gas and $H_2$ gas into the process chamber while gradually reducing the ratio of $H_2$ gas to silane-based gas supplied in the gas mixture to deposit the microcrystalline silicon film at a deposition rate greater than about 20 nm per minute by a CVD process, wherein the microcrystalline silicon film has a crystallized volume between about 20 percent to about 80 percent; and depositing a n-type semiconductor layer on the microcrystalline silicon film.

2. The method of claim 1, further comprising:
forming at least an underlying photoelectric converter on the substrate prior to forming the photoelectric converter, wherein the underlying photoelectric converter comprises:
depositing a p-type semiconductor layer;
depositing an i-type semiconductor layer by an silicon film on p-type semiconductor layer by a CVD process; and
depositing a n-type semiconductor layer on the i-type semiconductor layer.

3. The method of claim 1, wherein the silane based gas is flowed at a flow rate at least about 0.2 slm/m$^2$ and H$_2$ gas at a flow rate at least about 10 slm/m$^2$.

4. The method of claim 3, wherein the H$_2$ gas supplied in the gas mixture is varied during deposition.

5. The method of claim 3, wherein the H$_2$ gas supplied in the gas mixture is supplied from a relatively high H$_2$ gas ratio to a relatively low H$_2$ gas ratio.

6. The method of claim 3, wherein the H$_2$ gas supplied in the gas mixture is controlled by digital mode or by analog mode.

7. The method of claim 1, wherein flowing the gas mixture, further comprises:
maintaining the process pressure at a range greater than about 3 Torr; and
controlling the substrate temperature between about 100 degrees Celsius to about 400 degrees Celsius.

8. The method of claim 1, wherein flowing the gas mixture, further comprises:
applying a RF power density at least about 100 mWatts/cm$^2$.

9. The method of claim 1, wherein the microcrystalline silicon film is a hydrogenated silicon film having a hydrogen content between about 0.1 atomic percentage and about 20 atomic percentage.

10. The method of claim 2, wherein the i-type semiconductor in the underlying photoelectric converter is silicon material selecting from a group consisting of an amorphous silicon film, a microcrystalline silicon, and a polysilicon film.

11. The method of claim 1, further comprising:
depositing at least an overlying photoelectric converter on the photoelectric converter on the substrate, wherein the overlying photoelectric converter comprises:
depositing a p-type semiconductor layer;
depositing an i-type semiconductor layer by an silicon film on p-type semiconductor layer by a CVD process; and
depositing a n-type semiconductor layer on the i-type semiconductor layer.

12. The method of claim 11, wherein the i-type semiconductor in the overlying photoelectric converter is silicon material selecting from a group consisting of an amorphous silicon film, a microcrystalline silicon, and a polysilicon film.

13. The method of claim 1, wherein the p-type semiconductor and n-type semiconductor is formed by a silicon material selecting from a group consisting of an amorphous silicon film, a microcrystalline silicon, and a polysilicon film and having a thickness between about 5 nm and about 50 nm.

14. The method of claim 1, wherein the i-type semiconductor has a thickness between about 500 nm and about 10 μm.

15. A method of manufacturing a silicon based photoelectric converter, comprising:
providing a substrate on a substrate support assembly disposed in a process chamber, wherein the substrate support assembly includes cooling channels embedded therein;
forming a photoelectric converter on the substrate by depositing a microcrystalline silicon film as an i-type semiconductor layer disposed between a p-type semiconductor layer and a n-type semiconductor layer, wherein the microcrystalline silicon film is deposited by a gas mixture supplied from a diffuser having a curvature surface and a plurality of orifices on the curvature surface, wherein the orifices located in an inner region of the diffuser have higher cavity volumes and densities than the orifices located in an outer region of the diffuser.

16. The method of claim 15, wherein the i-type semiconductor is deposited at a deposition rate greater than about 20 nm per minute, wherein the i-type semiconductor has a crystallized volume between about 20 percent to about 80 percent.

* * * * *